United States Patent
Nishikido et al.

(10) Patent No.: US 8,711,263 B2
(45) Date of Patent: Apr. 29, 2014

(54) SOLID-STATE IMAGING DEVICE AND ELECTRONIC APPARATUS WITH ANTIREFLECTION STRUCTURE

(75) Inventors: Kenju Nishikido, Kumamoto (JP); Kazunori Nagahata, Kumamoto (JP)

(73) Assignee: Sony Corporation, Tokyo (JP)

( * ) Notice: Subject to any disclaimer, the term of this patent is extended or adjusted under 35 U.S.C. 154(b) by 251 days.

(21) Appl. No.: 13/317,469

(22) Filed: Oct. 19, 2011

(65) Prior Publication Data

US 2012/0120294 A1  May 17, 2012

(30) Foreign Application Priority Data

Nov. 12, 2010  (JP) .................................. 2010-254074

(51) Int. Cl.
*H04N 5/335* (2011.01)

(52) U.S. Cl.
USPC ............................. 348/308; 348/340; 257/437

(58) Field of Classification Search
USPC .................. 348/308; 257/437; 438/66, 68, 69
See application file for complete search history.

(56) References Cited

U.S. PATENT DOCUMENTS

| | | | | |
|---|---|---|---|---|
| 5,007,689 A * | 4/1991 | Kelly et al. | .................... | 359/350 |
| 6,614,479 B1 * | 9/2003 | Fukusho et al. | ............... | 348/340 |
| 7,744,951 B2 * | 6/2010 | Varaprasad | .................... | 427/162 |
| 2008/0087800 A1 | 4/2008 | Toda | | |
| 2009/0147101 A1 | 6/2009 | Tatani et al. | | |
| 2009/0280596 A1 * | 11/2009 | Akiyama | ......................... | 438/70 |
| 2009/0315134 A1 * | 12/2009 | Maruyama et al. | ........... | 257/437 |
| 2010/0006963 A1 * | 1/2010 | Brady | ............................ | 257/432 |
| 2010/0110271 A1 * | 5/2010 | Yanagita et al. | ............... | 348/340 |
| 2010/0133635 A1 * | 6/2010 | Lee et al. | ....................... | 257/433 |
| 2010/0244287 A1 * | 9/2010 | Hsu et al. | ....................... | 257/797 |
| 2011/0042770 A1 * | 2/2011 | Brady | ............................ | 257/432 |
| 2011/0051246 A1 * | 3/2011 | Schulz et al. | .................. | 359/586 |
| 2013/0009270 A1 * | 1/2013 | Tsai et al. | ....................... | 257/459 |

FOREIGN PATENT DOCUMENTS

| | | |
|---|---|---|
| JP | 2005-217439 | 8/2005 |
| JP | 2008-091753 | 4/2008 |
| JP | 2009-158944 | 7/2009 |
| JP | 2009-259934 | 11/2009 |

* cited by examiner

*Primary Examiner* — Nicholas Giles
*Assistant Examiner* — Abdelaaziz Tissire
(74) *Attorney, Agent, or Firm* — Rader, Fishman & Grauer PLLC

(57) ABSTRACT

A solid-state imaging device includes a pixel region formed on a semiconductor substrate, an effective pixel region and a shielded optical black region in the pixel region, a multilayer wiring layer formed on a surface of the side opposite to a light incident side of the semiconductor substrate, a supporting substrate bonded to a surface of the multilayer wiring layer side, and an antireflection structure that is formed on the bonding surface side of the supporting substrate.

4 Claims, 7 Drawing Sheets

SOLID-STATE IMAGING DEVICE AND ELECTRONIC APPARATUS WITH ANTIREFLECTION STRUCTURE

BACKGROUND

The present disclosure relates to a solid-state imaging device, and an electronic apparatus such as a camera including the solid-state imaging device.

As a solid-state imaging device (an image sensor), a CMOS solid-state imaging device, a CCD solid-state imaging device and the like are suggested. The solid-state imaging device is used in a digital still camera, a digital video camera, various types of portable terminal equipment such as a mobile phone including a camera, or the like. In recent years, accompanying miniaturization and lowered power consumption, a CMOS solid-state imaging device has been often used. In addition, a backside-illumination type of the CMOS solid-state imaging device has been developed in which a thinned semiconductor substrate is used, a pixel region including photodiodes in one surface (a light sensing surface) side of the semiconductor substrate is formed, and a multilayer wiring layer including wirings in a plurality of layers is installed in the other surface side of the semiconductor substrate opposite to the pixel region.

In the backside-illumination type Of the solid-state imaging device, since it is necessary to read and process a signal charge from the light sensing surface side of the semiconductor substrate to a signal processing circuit which is formed in the surface side opposite to the light sensing surface side, the thickness of the semiconductor substrate is thinned. Therefore, when light having a long wavelength such an infrared light is incident, the light may be easily transmitted to the multilayer wiring layer side, and the light, which is reflected at a supporting silicon substrate surface bonded to the multilayer wiring layer or at the wiring of the multilayer wiring layer, may be incident to photodiodes of the adjacent pixels and color-mixed. In addition, the incident-light may be incident to an optical black region which determines a shielded optical black level disposed at the outside of an effective pixel region of a pixel region, and a darkening problem which recognizes the pixel region as black in the state where the light is incident to the effective pixel region may occur.

As methods for suppressing color-mixing, the related arts are suggested in Japanese Unexamined Patent Application Publication Nos. 2009-259934, 2005-217439, and 2009-158944. In Japanese Unexamined Patent Application Publication No. 2009-259934, by installing an infrared ray cut filter film or a light shield film between the photodiode and the wiring layer, the infrared light which is transmitted to the light sensing surface and reflected at the wiring layer is cut, and color-mixing is prevented.

In Japanese Unexamined Patent Application Publication No. 2005-217439, in a process for manufacturing the backside-illumination type of the CMOS solid-state imaging device, a silicide film which is used in a gate electrode of a MOS transistor or an active region also remains in the photodiode region (the side opposite to the light sensing region). Thereby, the light which is incident from the rear surface is transmitted to the photodiode and reflected at the wiring, and the separated photodiode is prevented from being subjected to a photoelectric conversion.

In a solid-state imaging device disclosed in Japanese Unexamined Patent Application Publication No. 2009-158944, a layer wiring is formed, and an inner-optical filter layer cutting an infrared ray is formed in the lower layer of a color filter at the upper layer of an inner-layer lens. Thereby, sensitivity is improved and occurrence of color-mixing is suppressed.

Japanese Unexamined Patent Application Publication No. 2008-91753 discloses a device which simultaneously and independently obtains a color image and an infrared image using a single image sensor.

SUMMARY

FIG. 7 illustrates an example of a backside-illumination type of a CMOS solid-state imaging device in the related art. The solid-state imaging device 101 includes a pixel region 104 in which a plurality of pixels 103 constituted by photodiodes PD and a plurality of pixel transistors Tr in a thinned silicon semiconductor substrate 102 is two-dimensionally arranged. The photodiodes PD are formed along the depth direction from one surface which becomes the side of a light sensing surface of the semiconductor substrate 102. A plurality of the pixel transistors Tr is formed on the other surface which is the side opposite to the light sensing surface side of the semiconductor substrate 102. In FIG. 7, a plurality of the pixel transistors is represented by a transfer transistor (a MOS transistor) Tr including a single gate electrode 105 schematically illustrated. A multilayer wiring layer 108, in which wirings 107 in a plurality of layers are disposed via an interlayer insulating film 106, is formed on the other surface of the semiconductor substrate 102.

For example, the wirings 107 are constituted by a copper wiring and a barrier metal layer which are formed by a damascene process. A barrier metal layer 109 is formed on the wirings 107 of each layer. A light shield film 112 is formed on one surface of the light sensing surface side of the semiconductor substrate 102 via an insulating film 111. The light shield film 112 is formed while excluding the photodiodes PD in an effective pixel region 113. In addition, the light shield film 112 is formed so as to shield the entire surface of the pixel in the optical black region 114. Moreover, a color filter 116 and an on-chip lens 117 are formed via a planarized film 115.

On the other hand, the semiconductor substrate 102 in which the multilayer wiring layer 108 is formed is bonded to a supporting silicon substrate 121. In this case, a silicon nitride film 118 is formed on the surface of the multilayer wiring layer 108, and a silicon oxide film 119 is formed on the silicon nitride film 118. A silicon oxide film 124 is formed on the supporting substrate 121 via a silicon oxide film 122 and a silicon nitride film 123. In addition, for example, the silicon oxide film 119 on the surface of the multilayer wiring layer 108 side and the silicon oxide film 123 on the surface of the supporting substrate 121 are bonded by a plasma bonding method. A reference number 110 indicates an adhering surface, that is, a bonding surface.

In the backside-illumination type of the solid-state imaging device, there are concerns that a darkening problem may occur due to infiltration of light in the shielded optical black region 114 and a color-mixing may occur due to the infiltration of the light from other pixels to the effective pixel region 113. The present inventors validated through simulation with respect to the occurrence of the darkening and color-mixing. As a result, the present inventors proved that propagation of incident light L passing through the photodiodes PD dominated at layers which are lower than an interlayer insulating film 26. In addition, considering light reflections at interfaces having refractive index differences, it is considered that the light reflection at the interface between the silicon of the supporting substrate 121 having great refractive index difference and the insulating film thereon, for example the silicon oxide film 122 is the most dominant.

Japanese Unexamined Patent Application Publication Nos. 2009-259934, 2005-217439, and 2009-158944 describe technologies for solving color-mixing. However, the infiltration of light is influenced by leakage from various portions, and the darkening problem is difficult to be solved. The infrared ray cut filter film or the light shield film is formed between the photodiode and the wiring layer in Japanese Unexamined Patent Application Publication No. 2009-259934, between the silicon active layer and the wiring layer in Japanese Unexamined Patent Application Publication No. 2005-217439, between the color filter and the inner-layer lens in Japanese Unexamined Patent Application Publication No. 2009-158944, and between the wiring layer and the inner-layer lens in Japanese Unexamined Patent Application Publication No. 2008-91753 respectively. In view of the relationship of the formation position, the infrared ray cut filter film or the light shield film has a limitation in the thickness because the films is difficult to be thickly formed, and the films are difficult to manufacture so as to have a three-dimensional structure such as a moth-eye structure. In addition, the films may not prevent the infiltration of the light with respect to an intense light.

In Japanese Unexamined Patent Application Publication No. 2009-259934, since the light shield film demands an electric insulation, processing damage occurs or number of process is increased. In Japanese Unexamined Patent Application Publication No. 2005-217439, the silicide film can be covered over the entire surface of the pixel portion. However, the film may not prevent the infiltration of the light with respect to an intense light due to the thin film thickness. In addition, if the interlayer insulating film of the multilayer wiring layer is formed of materials having a high refractive index which is a high dielectric, damage such as RC delay of the wiring may occur.

It is desirable to provide a solid-state imaging device capable of suppressing the infiltration of light into an optical black region under a light shield film and occurrence of color-mixing in an effective pixel portion.

In addition, it is desirable to provide an electronic apparatus such as a camera including the solid-state imaging device.

According to an embodiment of the present disclosure, there is provided a solid-state imaging device including: a pixel region formed on a semiconductor substrate; and an effective pixel region and a shielded optical black region in the pixel region. In addition, the solid-state imaging devices includes a multilayer wiring layer formed on a surface of the side opposite to a light incident side of the semiconductor substrate, a supporting substrate bonded to a surface of the multilayer wiring layer side, and an antireflection structure formed on the bonding surface side of the supporting substrate.

In the solid-state imaging device of the embodiment of the present disclosure, since the antireflection structure is provided to the bonding surface side of the supporting substrate, the light reflection is suppressed at the interface of the supporting substrate of the bonding surface side. Since the light reflection is suppressed at the interface in which the light propagation is dominant, the infiltration of light into the optical black region shielded and the infiltration of light from the effective pixel region to other pixels are suppressed.

According to another embodiment of the present disclosure, there is provided an electronic apparatus including: a solid-state imaging device; an optical system that introduces incident light to a photoelectric conversion portion of the solid-state imaging device; and a signal processing circuit that processes an output signal of the solid-state imaging device.

The solid-state imaging device includes a pixel region formed on a semiconductor substrate and an effective pixel region and a shielded optical black region and an effective pixel region. In addition, the solid-state imaging devices includes a multilayer wiring layer formed on a surface of the side opposite to a light incident side of the semiconductor substrate, a supporting substrate bonded to the surface of the multilayer wiring layer side, and an antireflection structure formed in the vicinity of the bonding surface of the supporting substrate.

In the electronic apparatus of the embodiment of the present disclosure, since the antireflection structure is provided to the bonding surface side of the supporting substrate in the solid-state imaging device, the light reflection is suppressed at the interface of the supporting substrate of the bonding surface side. In addition, since the light reflection is suppressed at the interface in which the light propagation is dominant, the infiltration of light into the optical black region shielded and the infiltration of light from the effective pixel region to other pixels are suppressed.

According to the solid-state imaging device of the embodiment of the present disclosure, since the infiltration of light into the shielded optical black region is suppressed, the optical black level can be determined so as to be stable. The darkening problem is improved. Moreover, since the infiltration of light from the effective pixel region to other pixels is suppressed, occurrence of color-mixing can be suppressed.

According to the electronic apparatus of the embodiment of the present disclosure, since the optical black level can be determined so as to be stable and the occurrence of color-mixing can be suppressed in a solid-state imaging device, the electronic apparatus such as a camera having a high image quality can be provided.

DETAILED DESCRIPTION OF EMBODIMENTS

Hereinafter, embodiments of the present disclosure will be described. In addition, the description is performed by the following order.

1. Schematic Configuration Example of a COMS Solid-State Imaging Device

2. First Embodiment (Configuration Example of Solid-State Imaging Device)

3. Second Embodiment (Configuration Example of Solid-State Imaging Device)

4. Fourth Embodiment (Configuration Example of Electronic Apparatus)

1. Schematic Configuration Example of a CMOS Solid-State Imaging Device

Figure 1:
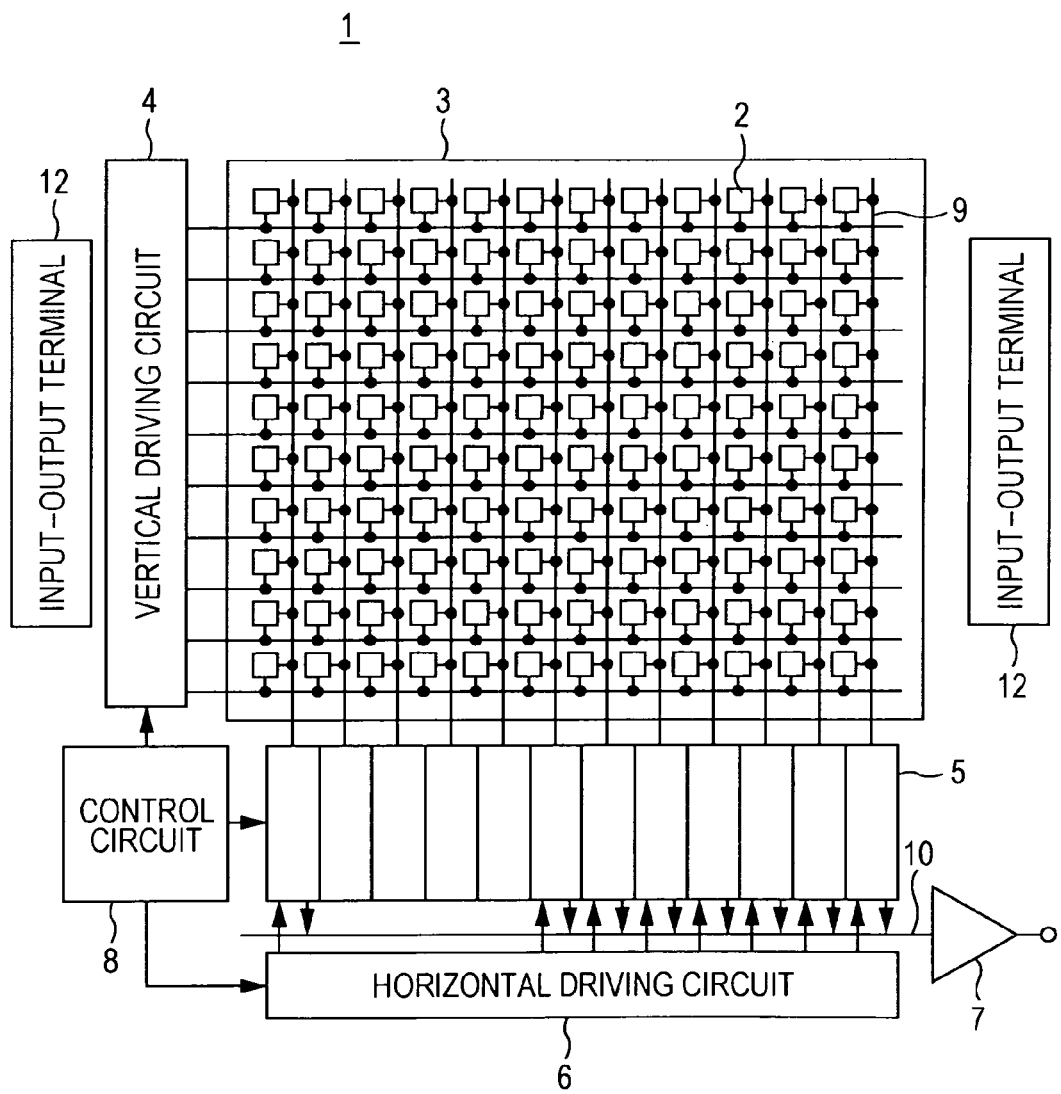
FIG. 1 is a schematic configuration diagram illustrating an example of a CMOS solid-state imaging device which is applied to each embodiment of the present disclosure.

FIG. 1 illustrates a schematic configuration of an example of a CMOS solid-state imaging device which is applied to each embodiment of the present disclosure. As illustrated in FIG. 1, a solid-state imaging device 1 of the present embodiment is constituted so as to include a pixel region (a so-called imaging region) 3 in which a plurality of pixels 2 including a photoelectric conversion portion is regularly arranged in the form of two-dimensional array on a semiconductor substrate, for example, a silicon substrate, and a periphery circuit portion. As the pixel 2, a unit pixel constituted by single photoelectric conversion portion and a plurality of pixel transistors can be applied. In addition, as the pixel 2, a so-called pixel sharing structure, in which a plurality of the photoelectric conversion portions share other pixel transistors excluding a transfer transistor, can be applied. A plurality of pixel transistors can be constituted by four transistors including the transfer transistor, a reset transistor, an amplification transistor, and a selection transistor, or by three transistors including the three transistors with the selection transistor omitted.

The periphery circuit portion is constituted so as to include so-called logic circuits such as a vertical driving circuit 4, a column signal processing circuit 5, a horizontal driving circuit 6, an output circuit 7, a control circuit 8, or the like.

The control circuit 8 receives data which commands an input clock, an operation mode, or the like, and outputs data such as an internal information of the solid-state imaging device. That is, the control circuit 8 generates a clock signal or a control signal and the like which are references of operations of the vertical driving circuit 4, the column signal processing circuit 5, and the horizontal driving circuit 6 or the like based on a vertical synchronizing signal, a horizontal synchronizing signal, and a master clock. In addition, those signals are input to the vertical driving circuit 4, the column signal processing circuit 5, the horizontal driving circuit 6, or the like.

For example, the vertical driving circuit 4 is constituted by shift registers and selects a pixel driving wiring. Further, the vertical driving circuit 4 supplies a pulse for driving the pixel to the selected pixel driving wiring and drives the pixel by a row unit. That is, the vertical driving circuit 4 selectively scans each pixel 2 of the pixel region 3 by a row unit in a sequentially vertical direction. In addition, the vertical driving circuit 4 supplies a pixel signal based on a signal charge to a column signal processing circuit 5 via a vertical signal line 9, and the signal charge is generated according to the amount of light received in, for example, a photodiode constituting a photoelectric conversion element of each pixel 2.

For example, the column signal processing circuit 5 is disposed at every column of the pixels 2, and performs signal processing such as noise removal of the signal output from the pixels 2 for one row at every pixel column. That is, the column signal processing circuit 5 performs signal processing such as CDS, signal amplification, AD conversion for removing specific fixed pattern noise of the pixel 2. A horizontal selection switch (not illustrated) is connected and installed between the column signal processing circuit and a horizontal signal line 10 in the output end of the column signal processing circuit 5.

For example, the horizontal drive circuit 6 is constituted by shift registers, sequentially selects each column signal processing circuit 5 by sequentially outputting a horizontal scan pulse, and outputs the pixel signal from each column signal processing circuit 5 to the horizontal signal line 10.

The output circuit 7 performs signal processing with respect to the signal which is sequentially supplied through the horizontal signal line 10 from each column signal processing circuit 5 and outputs the processed signal. For example, in the signal processing, only buffering may be performed, or a black level adjustment, a column deviation correction, and various digital signal processes, or the like may be performed. An input-output terminal 12 performs a signal exchange with the external portion.

2. First Embodiment

Configuration Example of Solid-State Imaging Device

Figure 2:
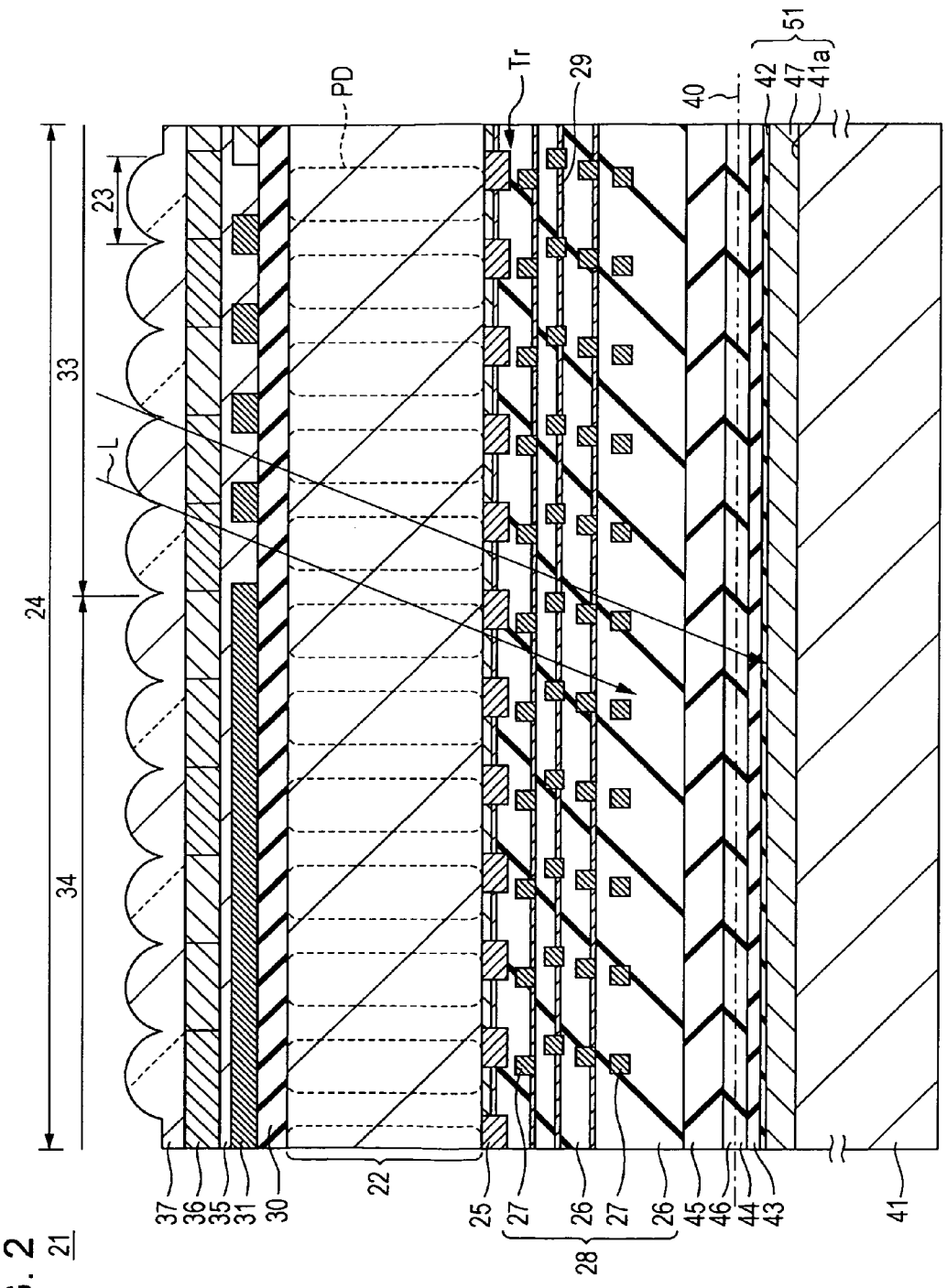
FIG. 2 is a schematic configuration diagram of a main portion illustrating a first embodiment of a solid-state imaging device of the present disclosure.

FIG. 2 illustrates a solid-state imaging device, that is, a backside-illumination type of a CMOS solid-state imaging device according to a first embodiment of the present disclosure. The solid-state imaging device 21 according to the first embodiment is constituted so as to include a pixel region 24 in which a plurality of pixels 23 constituted by photodiodes PD constituting the photoelectric conversion portion and a plurality of pixel transistors Tr in a thinned silicon semiconductor substrate, a silicon semiconductor substrate 22 in the present embodiment is two-dimensionally arranged. The photodiodes PD are formed along the depth direction from one surface (the rear surface) which becomes the side of a light sensing surface of the semiconductor substrate 22. In the present embodiment, the photodiodes PD are formed over the entire region in the thickness direction of the semiconductor substrate 22. Although not illustrated, the photodiodes PD are constituted so as to include a first conduction type, for example an n-type semiconductor region, which is used as both a photoelectric conversion and a charge storage, and a second conduction type, for example a p-type semiconductor region, which is disposed on the surface and the rear surface of the first conduction type and used to suppress dark current.

A plurality of the pixel transistors Tr is formed on the other surface (the front surface) which is the side opposite to the light sensing surface side of the semiconductor substrate 22. In FIG. 2, a plurality of the pixel transistors is represented by the transfer transistor (a MOS transistor) Tr including single gate electrode 25 schematically illustrated. A multilayer wiring layer 28, in which wirings 27 in a plurality of layers are disposed via an interlayer insulating film 26, is formed on the other surface (the front surface) of the semiconductor substrate 22. For example, a silicon oxide film is used as the interlayer insulating film 26. For example, the wirings 27 are formed by a copper wiring and a barrier metal layer which are formed by a damascene process. A barrier metal layer 29 is formed on the wirings 27 of each layer.

A light shield film 31 is formed on one surface of the light sensing surface side of the semiconductor substrate 22 via an insulating film 30 which is formed of a silicon oxide film or the like. The light shield film 31 is formed while excluding the photodiodes PD in an effective pixel region 33. In addition, the light shield film 31 is formed so as to shield the entire surface of the pixel in the optical black region 34. The shield film 31 is formed of a metal film. Moreover, a color filter 36 and an on-chip lens 37 are formed via a planarized film 35.

On the other hand, the semiconductor substrate 22 in which the multilayer wiring layer 28 is formed is bonded to a supporting substrate 41. That is, the semiconductor substrate 22 and the supporting substrate 41 are integrally bonded to each other. As the supporting substrate 41, preferably, a semiconductor substrate having the same property as the semiconductor substrate 22 may be used, and in the present embodiment, a silicon substrate is used. As the supporting substrate 41, the substrates other than the semiconductor substrate may be used. Insulating films 42, 43, and 44 are laminated on the supporting substrate 41. As the insulating films 42 and 44, for example, a silicon oxide film is used. In addition, as the insulating film 43, for example, a silicon nitride film is used. Insulating films 45 and 46 are laminated on the interlayer insulating film 26 which is the uppermost layer of the multilayer wiring layer 28. Here, for example, the interlayer insulating film 26 is a silicon oxide film. As the insulating film 45, for example, a silicon nitride film is used. In addition, as the insulating film 46, for example, a silicon oxide film is used. Moreover, the insulating film 46 formed of, for example, a silicon oxide film on the surface of the semiconductor substrate 22 side and the insulating film 44 formed of, for example, a silicon oxide film on the surface side of the supporting substrate 41 are bonded to each other by a plasma bonding method, for example. A reference number 40 indicates an adhering surface, that is, a bonding surface.

In addition, in the present embodiment, particularly, a light antireflection structure 51 is formed on the bonding surface side of the supporting substrate 41. That is, a material film 47, which has an intermediate refractive index between the refractive index of the supporting substrate 41 of the semiconductor and the refractive index of the insulating film 42 disposed on the supporting substrate 41, is formed between the supporting substrate 41 and the insulating film 42. Therefore, the light antireflection structure 51 is constituted by the insulating film 42, the material film 47, and the surface of the supporting substrate 41. The material film 47 may be formed of a film having 2.0 to 3.5 in the refractive index. In the present embodiment, the material film 47, which has the intermediate refractive index between the refractive index (3.5) of the silicon and the refractive index (1.4) of the silicon oxide film, is inserted between the silicon surface of the supporting substrate 41 and the silicon oxide film which is disposed right on the supporting substrate 41 and is the insulating film 42, and therefore, the antireflection structure 51 is constituted.

For example, the material film 47 is formed of one which is selected from SiN, TiO, ZnO, SnO, ZrO, $Al_2O_3$, AlN, or other materials, and the like. It is preferable that a metal oxide film is used as the material film 47. When a ZrO film (refractive index: 2.4) is used as the material film 47, it is preferable since the refractive index difference between the silicon of the supporting substrate 41 and the ZrO film is approximately the same as the refractive index difference between the ZrO film and the silicon oxide film 42.

When a silicon nitride film is used as the material film 42 instead of the silicon oxide film, the material film 47 is formed of one which is selected from TiO, ZnO, SnO, ZrO, $Al_2O_3$, or AlN.

According to the solid-state imaging device 21 of the first embodiment, since the light antireflection structure 51 is formed at the bonding surface side of the supporting substrate 41, the reflection of incident light L is suppressed by the light antireflection structure 51. That is, in the related art, since the refractive index difference between the silicon of the supporting substrate and the silicon oxide film disposed on the supporting substrate is great, the light reflection in the interface between the supporting substrate of silicon and the silicon oxide film is great. On the other hand, in the present embodiment, the refractive index difference between the insulating film 42 formed of a silicon oxide film and the material film 47 is small in which the insulating film 42 and the material film 47 constitute the light antireflection structure 51, and the refractive index difference between the supporting substrate 41 of the silicon and the material film 47 is small. Since the refractive index differences are small, the light reflection in the interface between the insulating film 42 and the material film 47 and the light reflection in the interface between the material film 47 and the supporting substrate 41 of the silicon are decreased respectively. Accordingly, the infiltration of light into the pixel of the shielded optical black region 34 is suppressed, a darkening problem is improved, and an optical black level can be obtained so as to be stable. Moreover, in the effective pixel region 33, the infiltration of light into other pixels is suppressed, and occurrence of color-mixing can be suppressed.

Since the material film 47 for making the refractive index difference small is formed at the bonding surface side of the supporting substrate 41, the thickness of the material film 47 is not limited, and the film thickness having a high freedom degree can be set. Accordingly, problems such as RC delay of the wiring 27 also do not occur.

3. Second Embodiment

Configuration Example of Solid-State Imaging Device

Figure 3:
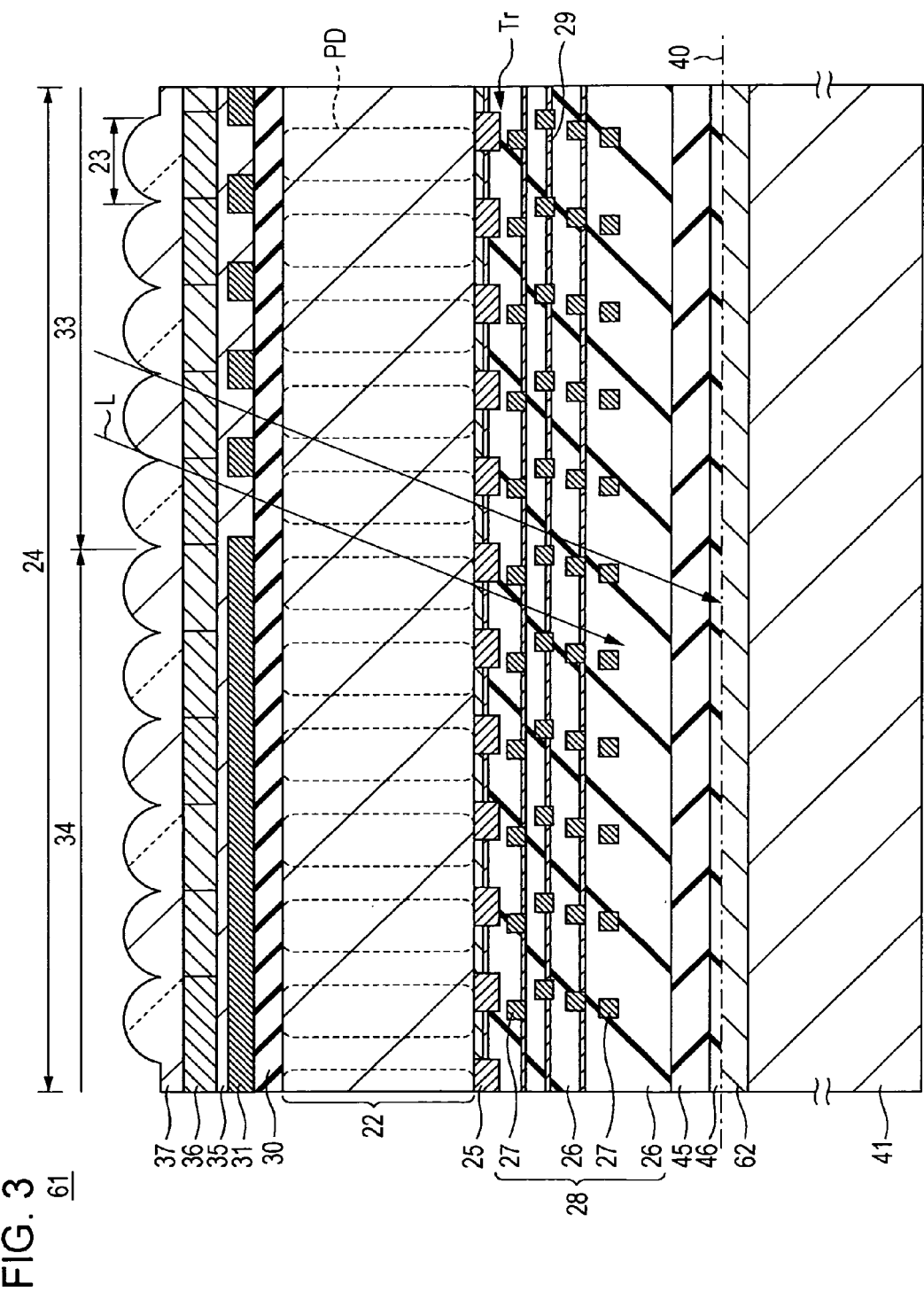
FIG. 3 is a schematic configuration diagram of a main portion illustrating a second embodiment of a solid-state imaging device of the present disclosure.

FIG. 3 illustrates a solid-state imaging device, that is, a backside-illumination type of a CMOS solid-state imaging device according to a second embodiment of the present disclosure. The solid-state imaging device 61 according to the second embodiment is constituted so as to include the pixel region 24 in which a plurality of the pixels 23 constituted by photodiodes PD constituting the photoelectric conversion portion and a plurality of the pixel transistors Tr in a thinned semiconductor substrate, the silicon semiconductor substrate 22 in the present embodiment is two-dimensionally arranged. The photodiodes PD are formed along the depth direction from one surface (the rear surface) which becomes the side of the light sensing surface of the semiconductor substrate 22. A plurality of the pixel transistors Tr is formed on the other surface (the front surface) which is the side opposite to the light sensing surface side of the semiconductor substrate 22. The multilayer wiring layer 28, in which the wirings 27 in a plurality of layers are disposed via the interlayer insulating film 26, is formed on the other surface (the front surface) of the side opposite to the light sensing surface side of the semiconductor substrate 22.

The light shield film 31 is formed on one surface of the light sensing surface side of the semiconductor substrate 22 via the insulating film 30 which is formed of a silicon oxide film or the like. The light shield film 31 is formed while excluding the photodiodes PD in the effective pixel region 33. In addition, the light shield film 31 is formed so as to shield the entire surface of the pixel in the optical black region 34. The shield film 31 is formed of a metal film. Moreover, the color filter 36 and the on-chip lens 37 are formed via a planarized film 35.

The semiconductor substrate 22 in which the multilayer wiring layer 28 is formed is bonded to the supporting substrate 41 which is formed of, for example, a silicon as the surface for bonding the multilayer wiring layer 28 side.

Figure 4A:
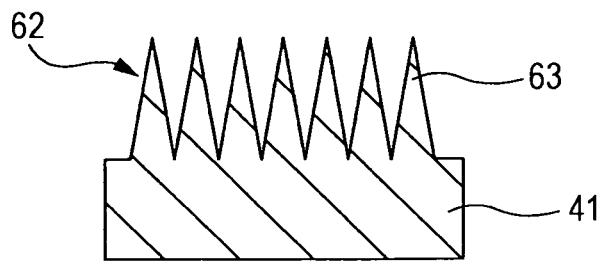
FIGS. 4A to 4C are process diagrams illustrating an example of a moth-eye structure and the bonding state according to the second embodiment.
Figure 4B:
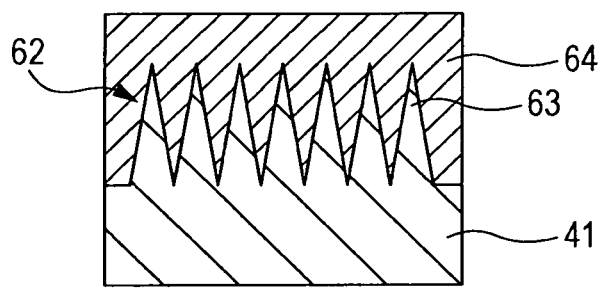
Figure 4C:
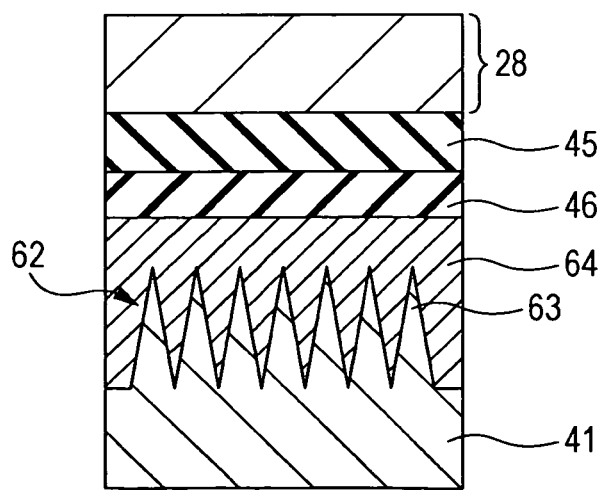

In the present embodiment, particularly, a light antireflection structure 62 constituted by a moth-eye structure is formed on the bonding surface side of the supporting substrate 41. For example, as illustrated in FIGS. 4A to 4C, in the moth-eye structure constituting the light antireflection structure 62, a plurality of fine convex portions 63 is arranged on the surface of, for example, the silicon substrate which is the supporting substrate 41. Therefore, entire configuration of the light antireflection structure 62 is constituted so as to form a fine concave-convex pattern (refer to FIG. 4A).

In FIGS. 4A to 4C, the surface of the moth-eye structure in the surface side of the supporting substrate 41 is planarized by the planarized film 64. As the planarized film 64, for example, an organic film, a boron phosphorous silicate glass (BPSG) film, or the like may be used (refer to FIG. 4B). The supporting substrate 41 and the semiconductor substrate 22 including the multilayer wiring layer 28 are bonded due to the fact that the insulating film 46 of the surface of the multilayer wiring layer 28 side and the planarized film 64 of the moth-eye structure are abutted and bonded to each other by the plasma bonding method (refer to FIG. 4C).

Figure 5A:
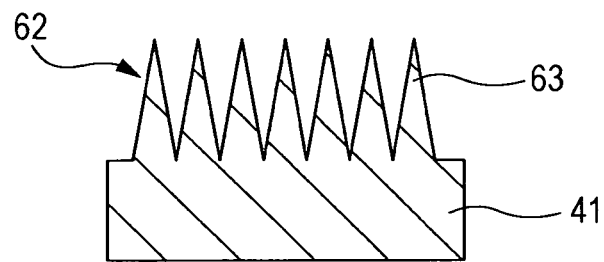
FIGS. 5A and 5B are process diagrams illustrating other example of a moth-eye structure and the bonding state according to the second embodiment.
Figure 5B:
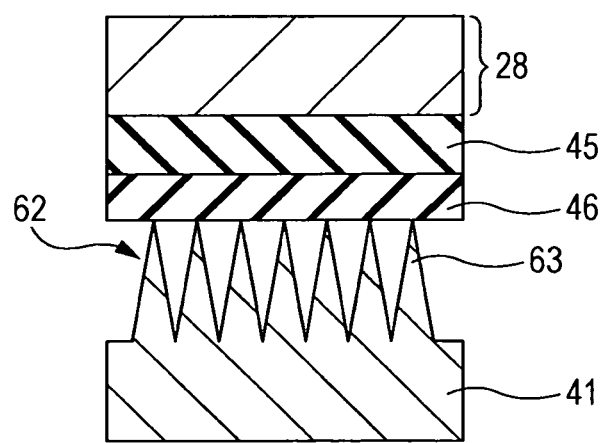

In addition, as illustrated in FIGS. 5A and 5B, without forming the planarized film 64, the fine concave-convex patterned surface of the moth-eye structure may be directly abutted to the insulating film 46 of the surface of the multilayer wiring layer 28 side and may be bonded by the plasma bonding method.

The moth-eye structure can be formed through a transfer forming by using a stamper, a blasting processing by spraying minute particles, a process combining a wet etching and a dry etching, or the like. The pitch of the fine convex portion 63 of the moth-eye structure may be about ½ or less of the wavelength of an infrared light which is incident into the deep portion, and, for example, may be about 400 nm. The height of the fine convex portion 63 may be about 1 μm to 2 μm. The fine convex portion 63 is more preferable as the height is greater, but may be 2 to 4 in the aspect ratio.

Since the other configurations are similar to those described in the first embodiment, in FIG. 3, the same reference numbers are attached to the portions corresponding to those of FIG. 2, and the duplicated descriptions are omitted.

According the solid-state imaging device 61 of the second embodiment, since the light antireflection structure 62 constituted by the moth-eye structure is formed at the bonding surface side of the supporting substrate 41, the reflection of the incident light L is suppressed by the light antireflection structure 62. That is, since the fine convex portion 63 is constituted so as to arrange in the moth-eye structure, the refractive index is changed so as to be great continuously from the surface of the moth-eye structure into the depth direction. Thereby, the refractive index difference is smaller as possible in the layer which is from the insulating film 42 to the surface of the supporting substrate 41 of the silicon via the light reflection film 62 of the moth-eye structure, and the light reflection is suppressed at the interface of the supporting substrate 41. Accordingly, the infiltration of light into the pixel of the shielded optical black region 34 is suppressed, a darkening problem is improved, and an optical black level can be made stable and fixed. Moreover, in the effective pixel region 33, the infiltration of light into other pixels is suppressed, and occurrence of color-mixing can be suppressed.

Since the light antireflection structure 62 constituted by the moth-eye structure is formed on the bonding surface side of the supporting substrate 41, the pitch of the moth-eye structure having a three-dimensional structure, the height, or the like can be set with a high freedom degree, and the light antireflection structure 62 can be formed over the entire surface of the supporting substrate 41. Accordingly, problems such as RC delay of the wiring 27 also do not occur.

4. Third Embodiment

Configuration Example of Electronic Apparatus

For example, the solid-state imaging devices of embodiments of the above-described present disclosure can be applied to electronic apparatuses of a camera such as a digital camera or a video camera, or a mobile phone having an imaging function, other apparatus having an imaging function, or the like.

Figure 6:
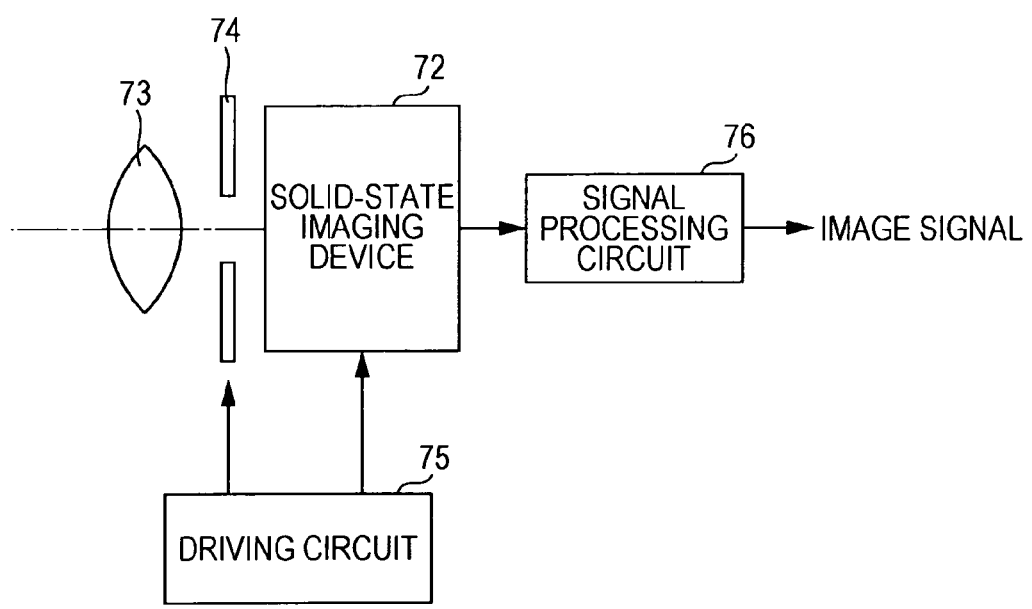
FIG. 6 is a schematic configuration diagram illustrating an example of an electronic apparatus according to a third embodiment of the present disclosure.
Figure 7:
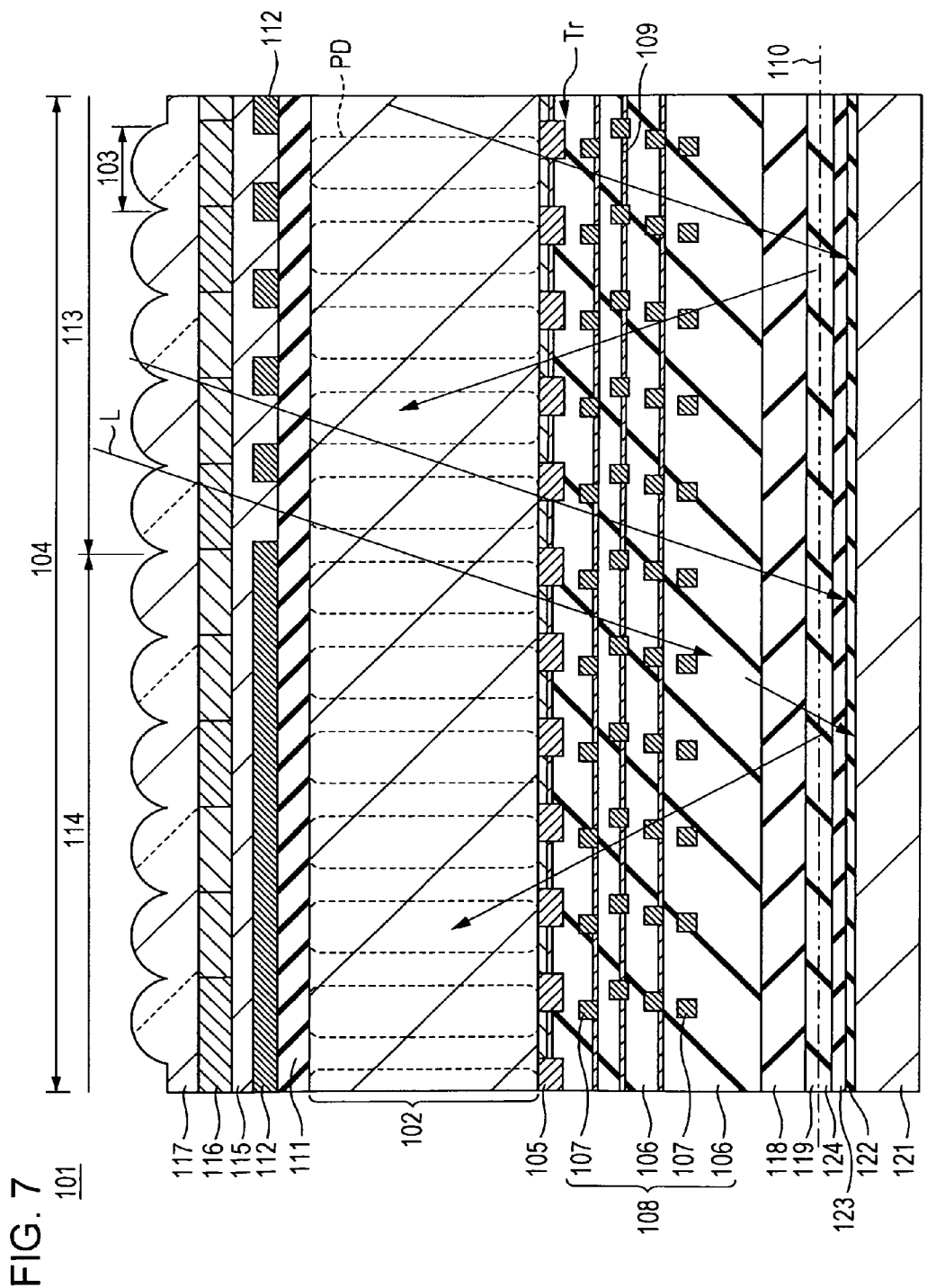
FIG. 7 is a schematic configuration diagram illustrating a solid-state imaging device according to an example of the related art.

FIG. 6 illustrates a third embodiment which is applied to a camera as an example of an electronic apparatus according to an embodiment of the present disclosure. The camera according to the present embodiment is exemplified to a video camera capable of performing photography of a static image or a moving image. The camera 71 of the present embodiment includes a solid-state imaging device 72, an optical systems 73 which introduces incident light into a received light sensing portion of the solid-state imaging device 72, a shutter unit 74, a driving circuit 55 which drives the solid-state imaging device 72, and a signal processing circuit 76 which process an output signal of the solids-state imaging device 72.

Any one of the solid-state imaging devices of the above-described embodiments is applied to the solid-state imaging device 72. The optical system (optical lens) 73 images an image light (incident light) from a subject on the imaging surface of the solid-state imaging device 72. Thereby, the signal charge is stored in the solid-state imaging device 72 for a predetermined interval. The optical system 73 may be an optical lens system which constituted by a plurality of optical lens. The shutter unit 74 controls the light irradiation interval and the light shield interval into the solid-state imaging device 72. The driving circuit 75 supplies the driving signal which controls the transfer operation of the solid-state imaging device 72 and the shuttering operation of the shutter unit 74. The signal transfer of the solid-state imaging device 72 is performed by the driving signal (timing signal) supplied from the driving circuit 75. The signal processing circuit 76 performs various signal processes. The image signal which is subjected to the signal processing is stored in a storage medium such as memory or output to a monitor.

According to electronic apparatus of the third embodiment, in the solid-state image device, the infiltration of light into the pixel of the shielded optical black region is suppressed, and an optical black level can be obtained so as to be stable. Moreover, in the effective pixel region, the infiltration of light into other pixels is suppressed, and occurrence of color-mixing can be suppressed. Accordingly, the electronic apparatus having high resolution can be provided. For example, a camera or the like having an improved image can be provided.

The present disclosure contains subject matter related to that disclosed in Japanese Priority Patent Application JP 2010-254074 filed in the Japan Patent Office on Nov. 12, 2010, the entire contents of which are hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. A solid-state imaging device comprising:
a pixel region formed on a semiconductor substrate;
an effective pixel region and a shielded optical black region in the pixel region;
a multilayer wiring layer formed on a surface of the side opposite to a light incident side of the semiconductor substrate;
a supporting substrate bonded to a surface of the multilayer wiring layer side; and
an antireflection structure formed on the bonding surface side of the supporting substrate,
wherein the antireflection structure comprises:
a surface of the supporting substrate;
an insulating film of the surface side of the supporting substrate; and
a film disposed between the supporting substrate and the insulating film, and includes an intermediate refractive index between the refractive index of the supporting substrate and the refractive index of the insulating film.

2. A solid-state imaging device comprising:
a pixel region formed on a semiconductor substrate;
an effective pixel region and a shielded optical black region in the pixel region;
a multilayer wiring layer formed on a surface of the side opposite to a light incident side of the semiconductor substrate;
a supporting substrate bonded to a surface of the multilayer wiring layer side;
an antireflection structure formed on the bonding surface side of the supporting substrate,
wherein the antireflection structure comprises a moth-eye structure at the bonding surface side of the supporting substrate, and
a planarized film formed on the surface of the moth-eye structure, and
wherein the supporting substrate includes a silicon substrate, and
the multilayer wiring layer and the supporting substrate are bonded to each other between the planarized film and the multilayer wiring layer.

3. An electronic apparatus comprising:
a solid-state imaging device;
an optical system that introduces incident light to a photoelectric conversion portion of the solid-state imaging device; and
a signal processing circuit that processes an output signal of the solid-state imaging device,
the solid-state imaging device including a pixel region formed on a semiconductor substrate, an effective pixel region and a shielded optical black region in the pixel region, a multilayer wiring layer formed on a surface of the side opposite to a light incident side of the semiconductor substrate, a supporting substrate bonded to a surface of the multilayer wiring layer side, and an antireflection structure formed on the bonding surface side of the supporting substrate,
wherein the antireflection structure comprises:
a surface of the supporting substrate;
an insulating film of the surface side of the supporting substrate; and
a film disposed between the supporting substrate and the insulating film, and includes an intermediate refractive index between the refractive index of the supporting substrate and the refractive index of the insulating film.

4. An electronic apparatus comprising:
a solid-state imaging device;
an optical system that introduces incident light to a photoelectric conversion portion of the solid-state imaging device; and
a signal processing circuit that processes an output signal of the solid-state imaging device,
the solid-state imaging device including a pixel region formed on a semiconductor substrate, an effective pixel region and a shielded optical black region in the pixel region, a multilayer wiring layer formed on a surface of the side opposite to a light incident side of the semiconductor substrate, a supporting substrate bonded to a surface of the multilayer wiring layer side, and an antireflection structure formed on the bonding surface side of the supporting substrate,
wherein the antireflection structure comprises a moth-eye structure at the bonding surface side of the supporting substrate, and
a planarized film formed on the surface of the moth-eye structure, and
wherein the supporting substrate includes a silicon substrate, and
the multilayer wiring layer and the supporting substrate are bonded to each other between the planarized film and the multilayer wiring layer.

\* \* \* \* \*